(12) United States Patent
Domsa et al.

(10) Patent No.: US 11,521,876 B2
(45) Date of Patent: Dec. 6, 2022

(54) HORIZONTAL SUBSTRATE BOAT

(71) Applicant: Tokyo Electron Limited, Tokyo (JP)

(72) Inventors: Ioan Domsa, Dublin (IE); Ian Colgan, Dublin (IE); Makoto Saito, Dublin (IE); Mitsuru Yamazaki, Iwate (JP); George Eyres, Dublin (IE)

(73) Assignee: Tokyo Electron Limited, Tokyo (JP)

( * ) Notice: Subject to any disclaimer, the term of this patent is extended or adjusted under 35 U.S.C. 154(b) by 486 days.

(21) Appl. No.: 16/293,471

(22) Filed: Mar. 5, 2019

(65) Prior Publication Data
US 2019/0279891 A1 Sep. 12, 2019

Related U.S. Application Data

(60) Provisional application No. 62/639,937, filed on Mar. 7, 2018.

(51) Int. Cl.
*H01L 21/67* (2006.01)
*H01L 21/673* (2006.01)

(52) U.S. Cl.
CPC .. *H01L 21/67326* (2013.01); *H01L 21/67109* (2013.01); *H01L 21/67313* (2013.01)

(58) Field of Classification Search
CPC .................................................. H01L 21/67326
See application file for complete search history.

(56) References Cited

U.S. PATENT DOCUMENTS

| | | | | |
|---|---|---|---|---|
| 4,461,386 A | * | 7/1984 | Turner | G11B 33/0472 118/500 |
| 4,653,636 A | * | 3/1987 | Armstrong | B05C 13/02 118/500 |
| 6,039,187 A | * | 3/2000 | Mendiola | H01L 21/67313 206/454 |
| 6,095,806 A | * | 8/2000 | Suzuki | C23C 16/4583 432/241 |
| 7,033,126 B2 | * | 4/2006 | Van Den Berg | H01L 21/67781 414/416.03 |

(Continued)

FOREIGN PATENT DOCUMENTS

JP 2549407 Y2 9/1997

OTHER PUBLICATIONS

Taiwanese IPO, First Office Action and Translation, dated Mar. 17, 2022, Taiwanese Patent Application No. 108107565, 13 pages.

*Primary Examiner* — Nathaniel Herzfeld
(74) *Attorney, Agent, or Firm* — Slater Matsil, LLP (57) ABSTRACT

A horizontal substrate carrier is provided, for example a carrier for holding semiconductor substrates during horizontal thermal processing. The horizontal substrate carrier has asymmetrically placed support rails. One side of the horizontal substrate carrier has no upper rail while the other side of the horizontal substrate carrier has an upper rail placed at a relatively high location, for example at an angular location of 60° or more, more preferably of 70° or more, and most preferably at 90°. The side without an upper rail may be used for robotic loading of the horizontal substrate carrier. In a preferred embodiment, only three rails are provided: one upper rail on one side and two lower rails. The use and placement of these three rails can hold the substrate in precise uniform locations, minimize substrate movement, and minimize particle generation, all while allowing for easy robotic access.

21 Claims, 5 Drawing Sheets

(56) References Cited

U.S. PATENT DOCUMENTS 7,270,240 B2* 9/2007 Niese .................. H01L 21/6734
211/41.18
2013/0161313 A1* 6/2013 Murakami ............. H01L 21/22
219/392

* cited by examiner

HORIZONTAL SUBSTRATE BOAT

CROSS REFERENCE TO RELATED APPLICATIONS

Pursuant to 37 C.F.R. § 1.78(a)(4), this application claims the benefit of and priority to prior filed Provisional Application Ser. No. 62/639,937 filed Mar. 7, 2018, which is expressly incorporated herein by reference.

BACKGROUND

The present disclosure relates to the processing of substrates, such as for example, semiconductor substrates. In particular, it provides a novel horizontal carrier for holding substrates during thermal processing of the substrates.

In substrate processing, one common step involves the use of high temperature furnace processing. In furnace processing, a substrate carrier (or boat) for holding a plurality of substrates is used, for example a quartz carrier. A carrier loaded with a plurality of substrates may then be placed in the furnace. One type of furnace operation is a horizontal furnace operation using carriers designed specifically for horizontal furnaces. In such carriers, a plurality of substrates is held vertically in the horizontal carriers.

Figure 1:
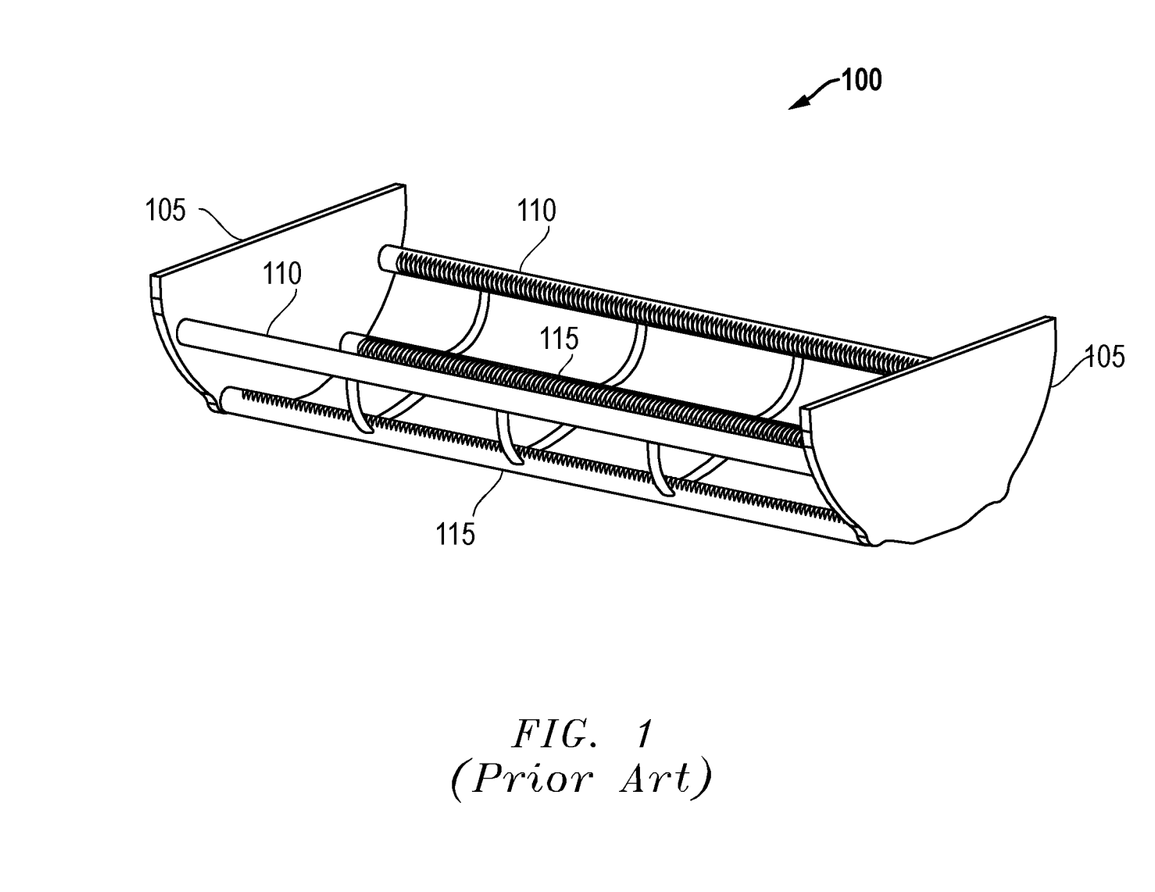
FIG. 1 illustrates a prior art horizontal substrate carrier.
Figure 2:
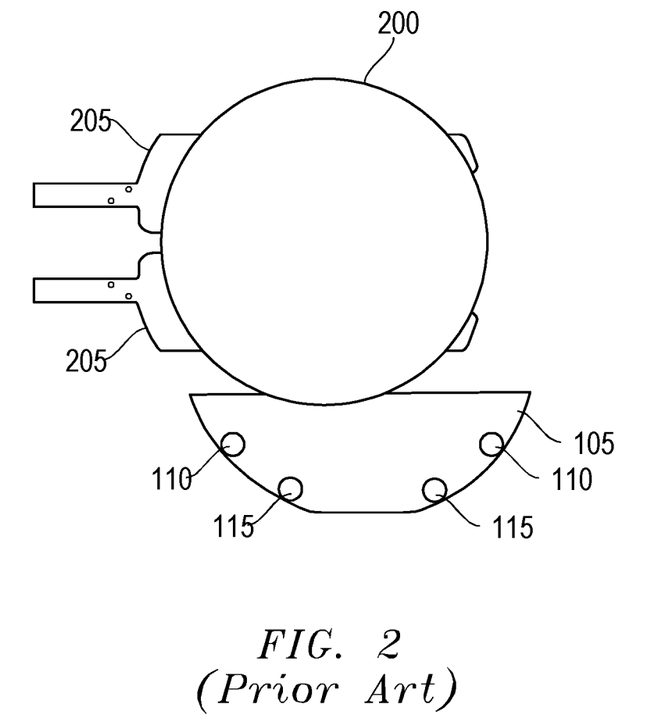
FIG. 2 illustrates robotic loading of a substrate in the prior art substrate carrier of FIG. 1.

An exemplary prior art substrate carrier 100 is shown in FIG. 1. The carrier includes support structures 105 at either end (for example a front plate and rear plate), two upper rails 110 and two lower rails 115. Such carriers may be made to hold a large plurality of substrates, for example, one hundred or more substrates. Each of the upper rail 110 and lower rail 115 include a plurality of slots positioned relative to each other within which a substrate may be held. Though FIG. 1 illustrates a four rail configuration, other prior art configurations may include three rods (one center bottom rod) and two upper rods on the sides. FIG. 2 illustrates how a substrate 200 may be loaded into the prior art carrier of FIG. 1. As shown in FIG. 2, a portion of a fork 205 of a robotic substrate loader (not shown) is used to load the substrate 200 in the substrate carrier 100 by engaging the substrate in the slots of the upper rails 110 and lower rails 115.

When held in the slots of the upper rails 110 and lower rails 115, the substrates are positioned to be uniformly placed in a vertical manner within the substrate carrier. Such prior art carriers often hold the substrates with a tolerance of +/−2 to 3 degrees of vertical. As the substrate carriers are moved (for example into a furnace), vibration may cause the substrates to "rattle" inside the slots and/or the substrates to angularly rotate within the substrate carrier. The +/−2 to 3 degrees of vertical holding of the substrates exacerbates this problem. When such movement occurs, unwanted particle contamination formation may occur where the substrate engages the substrate carrier.

It would be desirable to provide an improved horizontal substrate carrier for holding substrates in a manner that decreases particle contamination, while allowing for ease of robotic loading of the carriers.

SUMMARY

Described herein is an innovative horizontal substrate carrier. A horizontal substrate carrier may, for example, be a carrier for holding semiconductor substrates during horizontal thermal processing. The horizontal substrate carrier has asymmetrically placed support rails. One side of the horizontal substrate carrier has no upper rail while the other side of the horizontal substrate carrier has an upper rail placed at a relatively high location, for example at an angular location of 60° or more, more preferably of 70° or more, and most preferably at 90°. In one embodiment, the angular location may be greater than 90°, such as for example but not limited to 120°. The side without an upper rail may be used for robotic loading of the horizontal substrate carrier. In a preferred embodiment, only three rails are provided: one upper rail on one side and two lower rails. The use and placement of these three rails can hold the substrate in precise uniform locations, minimize substrate movement, and minimize particle generation, all while allowing for easy robotic access. In one embodiment, the configuration described herein provides a carrier in which the substrates may be held with relatively little vertical tilt. In one embodiment, the substrates may be held with a tolerance of +/−1 degrees of vertical deviation or less, and more preferably a tolerance of +/− less than 0.5 degree of vertical deviation, and even more preferably a tolerance of +/− less than 0.1 degree of vertical deviation may be achieved.

In one embodiment, a horizontal substrate carrier is provided. The horizontal substrate carrier may comprise a plurality of horizontal rails, the horizontal rails extending along the horizontal substrate carrier horizontally. A plurality of slots for holding a substrate a provided, the slots located in the plurality of horizontal rails. The plurality of horizontal rails may be arranged so that only slots of three horizontal rails will engage a substrate carried in the horizontal substrate carrier. The plurality of horizontal rails are asymmetrical such that a first side of the horizontal substrate carrier has a first upper rail and a second side of the horizontal substrate carrier does not have a corresponding second upper rail, the first upper rail being at an angular position of 60 degrees or more relative to a vertical line through a horizontal axis of the horizontal substrate carrier and a bottom of the horizontal substrate carrier.

In another embodiment, a horizontal substrate carrier is provided. The horizontal substrate carrier may comprise a plurality of horizontal rails, the plurality of horizontal rails extending along the horizontal substrate carrier horizontally between a first end support structure at a first end of the horizontal substrate carrier and a second end support structure at a second end of the horizontal substrate carrier. First ends of the plurality of horizontal rails are connected to the first end support structure and second ends of the plurality of horizontal rails are connected to the second end support structure. The plurality of horizontal rails may comprise a first lower rail on a first side of the horizontal substrate carrier, a second lower rail on a second side of the horizontal substrate carrier, and a first upper rail on a first side of the horizontal substrate carrier. The plurality of horizontal rails are configured so that only three horizontal rails engage a substrate when the substrate is carried in the horizontal substrate carrier. The first upper rail is at an angular position of 60 degrees or more relative to a vertical line through a horizontal axis of the horizontal substrate carrier and a bottom of the horizontal substrate carrier and the first lower rail and the second lower rail are both at angular positions of 45 degrees or less relative to the vertical line through the horizontal axis of the horizontal substrate carrier and the bottom of the horizontal substrate carrier. None of the plurality of horizontal rails are located on the second side of the horizontal substrate carrier at angular positions of 45 degrees or more In yet another embodiment, a horizontal substrate carrier is provided. The horizontal substrate carrier may comprise a plurality of horizontal rails, the plurality of horizontal rails extending along the horizontal substrate carrier horizontally between a first end support structure at a first end of the horizontal substrate carrier and a second end support structure at a second end of the horizontal substrate carrier. First ends of the plurality of horizontal rails connect to the first end support structure and second ends of the plurality of horizontal rails connect to the second end support structure. The plurality of horizontal rails comprise a first lower rail on a first side of the horizontal substrate carrier, a second lower rail on a second side of the horizontal substrate carrier, and a first upper rail on a first side of the horizontal substrate carrier. The horizontal substrate carrier also comprises a counterbalance positioned on the second side of the horizontal substrate carrier. The plurality of horizontal rails are configured so that only three horizontal rails engage a substrate when the substrate is carried in the horizontal substrate carrier. The first upper rail is at an angular position of 70 to 90 degrees relative to a vertical line through a horizontal axis of the horizontal substrate carrier and a bottom of the horizontal substrate carrier, and the first lower rail and the second lower rail both are at angular positions of 30 degrees or less relative to the vertical line through the horizontal axis of the horizontal substrate carrier and the bottom of the horizontal substrate carrier. None of the plurality of horizontal rails is located on the second side of the horizontal substrate carrier at angular positions of 45 degrees or more.

In yet another embodiment, a substrate processing system is provided. The substrate processing system may comprise a furnace having a horizontal heating chamber; and at least one horizontal substrate carrier within the horizontal heating chamber. The at least one horizontal substrate carrier may comprise a plurality of horizontal rails, the horizontal rails extending along the horizontal substrate carrier horizontally and a plurality of slots for holding a substrate, the slots located in the plurality of horizontal rails, the plurality of horizontal rails arranged so that only slots of three horizontal rails will engage a substrate carried in the horizontal substrate carrier. The horizontal substrate carrier is configured so that the plurality of horizontal rails are asymmetrical such that a first side of the horizontal substrate carrier has a first upper rail and a second side of the horizontal substrate carrier does not have a corresponding second upper rail, the first upper rail being at an angular position of 60 degrees or more relative to a vertical line through a horizontal axis of the horizontal substrate carrier and a bottom of the horizontal substrate carrier.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 3:
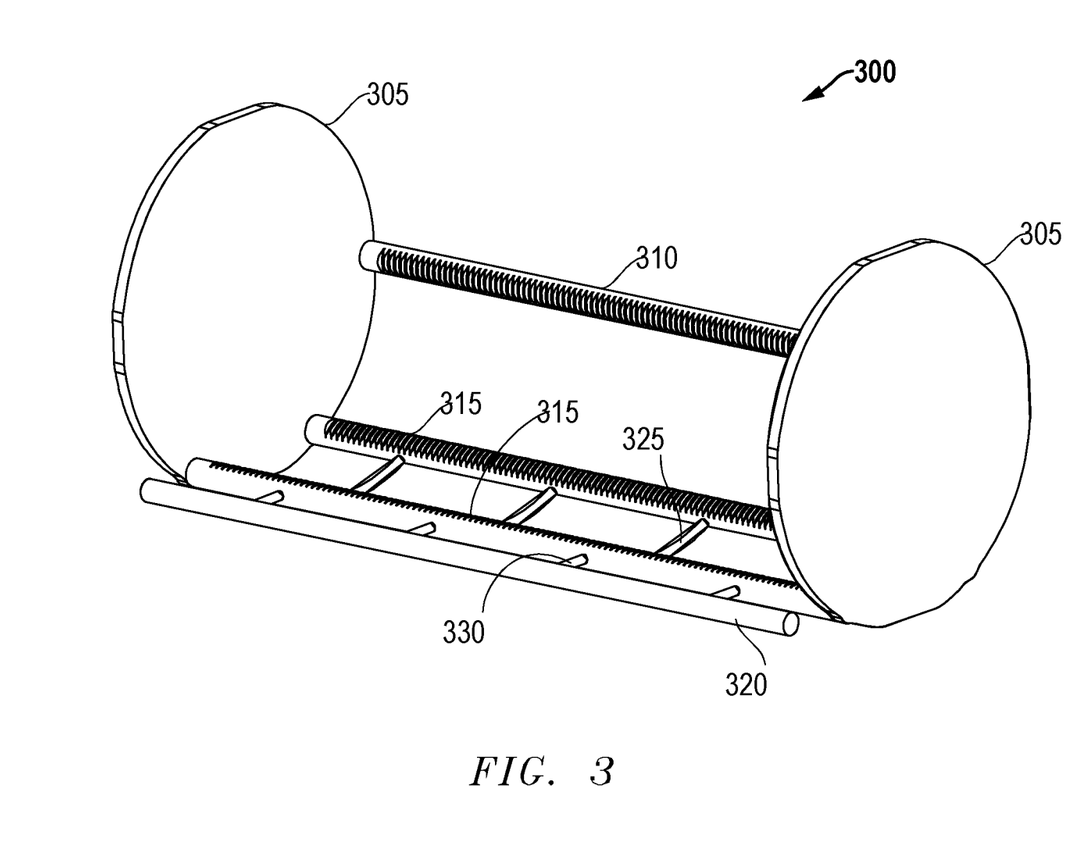
FIG. 3 provides a perspective view of one exemplary embodiment of a horizontal substrate carrier as disclosed herein.

An exemplary horizontal substrate carrier constructed according to the techniques disclosed herein is provided in FIG. 3. The horizontal substrate carrier may be used to carry a wide range of substrate types. For example, in one embodiment, the substrate may be a semiconductor substrate such as a semiconductor wafer. Further, the horizontal substrate carrier may be used during part of a wide range of substrate processing steps. In one example, the horizontal substrate carrier may be used to load substrates into a horizontal furnace. In such horizontal substrate carriers, the substrates are typically held vertically, perpendicular to the ground. In one embodiment, disclosed herein is a substrate processing system which comprises a furnace having a horizontal heating chamber within which a plurality of substrates are held vertically by horizontal substrate carriers that are within the heated chamber. Such a furnace may be used, for example, when thermally processing the substrate. One exemplary process is a thermal anneal process in which the substrate is heated to affect some physical or electrical property of the structures formed on the substrate. It will be recognized that the horizontal substrate carrier described herein may be used in other horizontal process equipment, for example, but not limited to deposition equipment, oxidation equipment, etc.

As shown in FIG. 3 a horizontal substrate carrier 300 is provided. The horizontal substrate carrier 300 may include end support structures 305 at either end of the horizontal substrate carrier 300 (for example a front plate and rear plate). The horizontal substrate carrier 300 may further included one upper rail 310 and two lower rails 315. In one embodiment, upper rail 310 and two lower rails 315 are rod-like in shape. The upper rail 310 and lower rails 315 extend between the end support structures 305 and serve as horizontal rails for holding substrates in the horizontal substrate carrier 300. Supports 325 may be provided between the lower rails 315. It will be recognized by those skilled in the art that the advantageous concepts described below are not limited to the particular embodiment of support structures shown in FIG. 3. For example, a horizontal substrate carrier could be formed without the use of the end support structures 305. In one example in which end support structures are not used, the upper rail 310 may be connected to one of the lower rails 315 through the use of additional supports 325.

As shown in FIG. 3, the horizontal substrate carrier 300 includes a counterbalance 320 connected to one of the lower rails 315 by supports 330. Counterbalance 320 provides balance stability to the horizontal substrate carrier 300 by attaching the counterbalance to the lower rail 315 which is on the opposite side of the horizontal substrate carrier 300 from the upper rail 310. The counterbalance 320 may be weighted to provide an even weight distribution such that the horizontal substrate carrier 300 may be balanced in a manner that decreases the likelihood of the horizontal substrate carrier 300 tipping to one side (tipping to the side of the upper rail 310). As shown in FIG. 3, the counterbalance 320 is a rod-like counterbalance that extends along the length of the horizontal substrate carrier 300. It will be recognized that such a counterbalance construction is merely one embodiment, and other embodiments may be used. For example, the supports 330 may connect the counterbalance 320 directly to the end support structures. Alternatively, the counterbalance may be, for example, but not limited to, a separate counterbalance structures located only at each end support structure. In yet another embodiment, the counterbalance may be integrally formed with one of the lower rails 315. In yet another embodiment, the counterbalance and one lower rail 315 may be formed together by weighting the lower rail 315 opposite the upper rail 310 more than the other lower rail. In this manner, a single structure may act both as one lower rail and the counterbalance.

Figure 4:
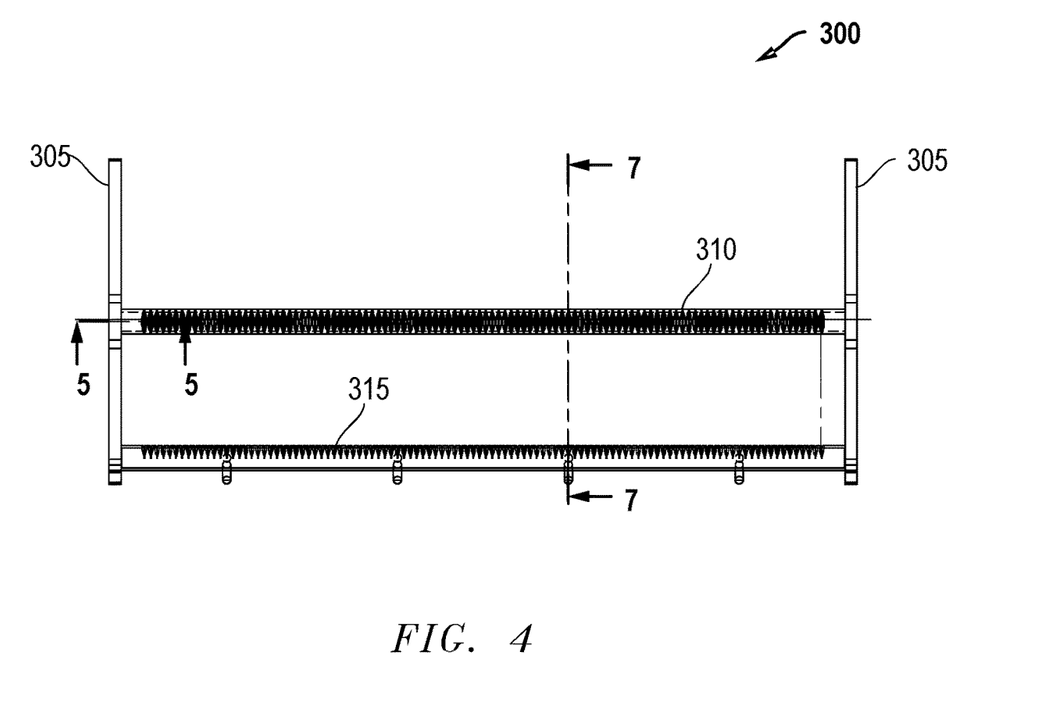
FIG. 4 provides a side view of the horizontal substrate carrier of FIG. 3.
Figure 5:
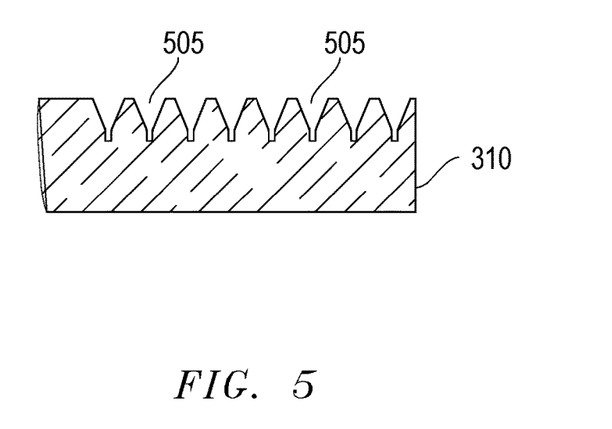
FIG. 5 illustrates exemplary slots for use with the horizontal substrate carrier of FIG. 3 along section line 5-5 of FIG. 4.
Figure 7:
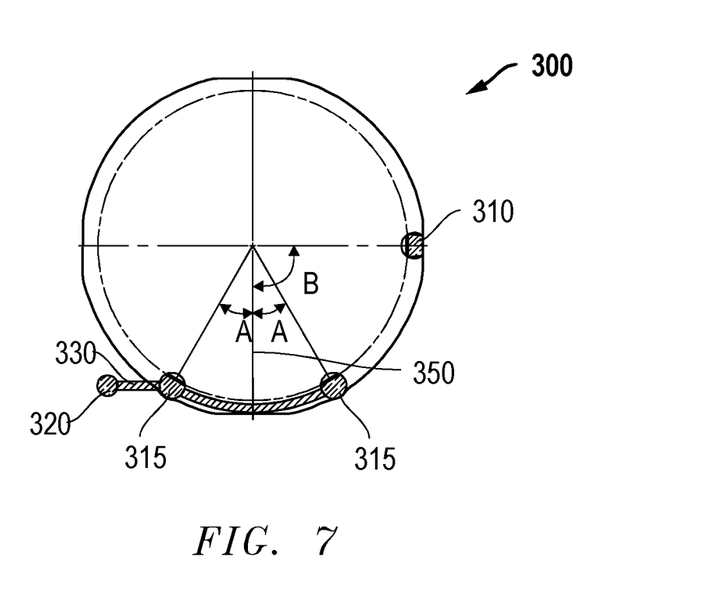
FIG. 7 illustrates a cross-section view of the horizontal substrate carrier of FIG. 3 along section line 7-7 of FIG. 4.

FIG. 4 illustrates a side view of the horizontal substrate carrier 300 of FIG. 5. FIG. 4 also illustrates section line 5-5 and section line 7-7. A cross-section of section line 5-5 is shown in FIG. 5 and illustrates the slots 505 contained within the upper rail 310 used for supporting individual substrates. Similar slots are aligned in the lower rails 315 to provide three points of support for holding the substrates in the horizontal substrate carrier 300. As shown in the figure, the slots 505 are of a "Y" shape variation. Various slot shapes are known in the art and the concepts disclosed herein are not limited to the slot shape shown in FIG. 5. For example, the rather than the "Y" shape shown other "Y" shapes may be used, such as those having longer or shorter base and open portions of the "Y." Alternative, the slots may be a "V" shape, may be rounded, or may have a combination of shapes, all as it known in the industry. Further, not all the rails need use the same slot shape as different shapes may be used on different rails.

Figure 6:
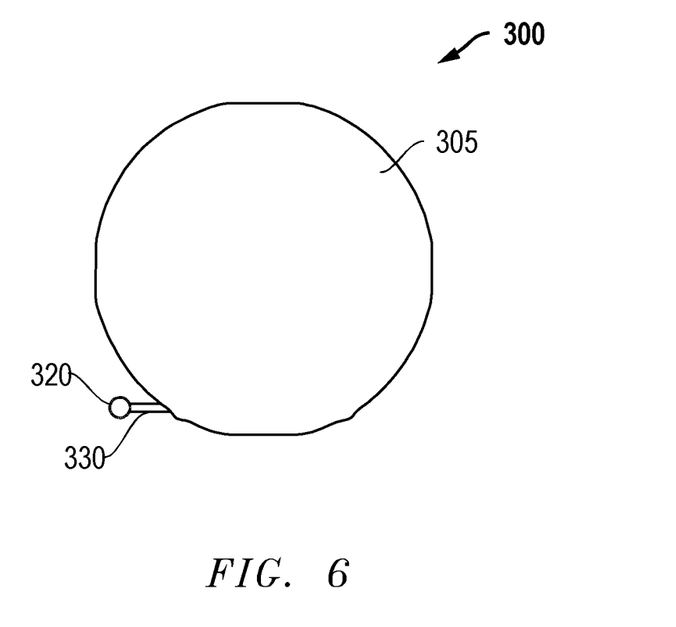
FIG. 6 illustrates an end view of the horizontal substrate carrier of FIG. 3.

FIG. 6 shows an end view of the horizontal substrate carrier 300. As shown in FIG. 6, an end support structure 305 which is generally circular in shape is provided. As mentioned above, the use of the end support structure 305 is optional, as the various rails may be structurally connected in other manners. Further, the end support structure is not limited to a circular shape, as it will be recognized by those skilled in the art shapes may be utilized. End support structures 305 provided structural integrity to the horizontal substrate carrier 300. Supports 325 also provide structural integrity to the horizontal substrate carrier 300. Further, additional reinforcements, rods, rails, bridges and the like may be utilized between and among the end support structures 305, upper rail 310 and/or lower rails 315 in a variety of manners while still obtaining the benefits of the techniques disclosed herein. FIG. 7 shows a cross-section view of the horizontal substrate carrier 300 along section line 7-7 of FIG. 4. FIG. 7 also provides a frame of reference for the angular positions of the upper rail 310 and lower rails 315. The view of FIG. 7 provides a view of a plane in parallel with the planes of the substrates. An angular position of the lower rails 315 may be defined by the angle A as shown in FIG. 7 with reference to a vertical line 350. More particularly, as shown in the figure, angles A and B are provided relative to a vertical line which extends from the horizontal axis of the horizontal substrate carrier (the center point axis into and out of the plane of the figure) to the bottom of the horizontal substrate carrier. Note, in the embodiment of FIG. 7, the angular position of the lower rails has the same angular distance on each side of the vertical line 350 as shown. It will be recognized, however, that this is merely one embodiment and the angles for the angular position of the lower rods may have differing absolute values. As shown in FIG. 7, the upper rail 310 may be located at an angular position defined by an angle B, the reference point for angles A and B being the same reference line.

Thus, as shown in the figures, in one embodiment a horizontal substrate carrier 300 is provided which has a plurality of horizontal rails, the horizontal rails extending along the horizontal substrate carrier horizontally. In this embodiment, each of the horizontal rails includes a plurality of slots for holding a substrate and the plurality of horizontal rails are arranged so that only slots of three horizontal rails will engage a substrate carried in the horizontal substrate carrier. In the manner shown, the plurality of horizontal rails are asymmetrical such that a first side of the horizontal substrate carrier has a first upper rail, upper rail 310, and a second side of the horizontal substrate carrier does not have a corresponding second upper rail. Thus, for example as shown in FIG. 7, the right side of the horizontal substrate carrier has an upper rail 310, while the left side does not have an upper rail. As shown in the figures, one lower rail 315 is positioned on the left side of the horizontal substrate carrier and the other lower rail is positioned on the right side of the horizontal substrate carrier. Further, the plurality of horizontal rails (upper rail 310 and the left and right side lower rails 315) extend along the horizontal substrate carrier horizontally between the two end support structures 305, one at a first end of the horizontal substrate carrier and a second at a second end of the horizontal substrate carrier. First ends of the plurality of horizontal rails connect to one end support structure 305 and second ends of the plurality of horizontal rails connect to the other end support structure. The horizontal substrate carrier 300 is provided with a counterbalance positioned on the opposite side of the horizontal substrate carrier as the upper rail 310 is positioned. Thus, as shown in FIG. 7, the right side of the horizontal substrate carrier 300 includes upper rail 310 and the right side lower rail 315. The left side of the horizontal substrate carrier 300 includes the left side lower rail 315 and the counterbalance 320. The weights of the various rails, supports, and the counterbalance can be together configured to provide a balanced mass such that tipping left or right does not occur.

As compared to prior art techniques, the design of the horizontal substrate carrier described herein provides an advantageous optimization of a variety of factors including (1) substrate holding ability (increased holding decreases wafer movement and decreased particular contamination due to the decrease in wafer movement) (2) the number of in substrate contact points, (3) precision in holding substrates vertically and (4) allowing for ease of use with robotic substrate loading apparatus. More specifically, it has been recognized that prior art lower rails provide the primarily carrier the substrate load and prior art upper rails serve to hold the substrates vertically positioned. Moreover, as upper rails are moved upward (i.e. angle B is increased), substrates are more precisely held vertically and parallel in relation to each other. In prior art designs, however, the upper rails are generally positioned at a maximum angle B of 40° to 45°, as anything higher would interfere with the forks of the robotic loading equipment. Such a low location, however, provides for more tilting of the substrates making robotic loading more difficult. Further, the lower placement of the upper rails in prior art designs allows for increased rattling of the substrates within the slots, and provides for a corresponding increase in particle formation. It is noted that as the angle of the lower rails decreases, the substrates will tilt less, but the likelihood of angular rotation of a substrate in the carrier will increase. When wafer tilting is large, the parallel misalignment between robotic handling fork and substrates can lead to substrate scratching with the slots of the carrier during gripping and extracting. Substrate scratching generates significant amount of particles.

The problems of the prior art are balanced and solved by providing no upper rail on one side of the horizontal substrate carrier 300 and positioning the upper rail 310 on the other side of the horizontal substrate carrier at an angle B that is greater than or equal to 60°, more preferable greater than or equal to 70°, even more preferably at an angle B of 70° to 90°, and even more preferably at an angle B of 90°. Further, it will be recognize that the angle B may even exceed 90°. For example, angle B may be 120°, providing even more stability to the ability of the horizontal substrate carrier 300 to hold substrates substantially vertically with minimal movement or "rattle" of the substrates in the carrier. Thus, an asymmetrical rail design is provided in which there is a single upper rail that does not have a corresponding upper rail on the opposing side of the horizontal substrate carrier.

The two lower rails 315 may be positioned at angle A that is less than or equal to 45°, more preferable less than or equal to 30°, and even more preferably between 25° and 30°. Such a combination together provides a number of benefits. First, as only three contact points between the substrate and the horizontal substrate carrier 300 are utilized the amount of particle contamination can be decreased (as compared to using more than three rails). Further, the high angle of the upper rail 310 decreases substrate rattling, movement and rotation in the horizontal substrate carrier 300. More specifically, the configuration described herein provides a carrier in which the substrates may be held with relatively little vertical tilt. In one embodiment, the substrates may be held with a tolerance of +/−1 degrees of vertical deviation or less, and more preferably a tolerance of +/− less than 0.5 degree of vertical deviation, and even more preferably a tolerance of +/− less than 0.1 degree of vertical deviation may be achieved. This configuration decreases particle formation as compared to prior art carrier configurations. The upper rail placement also adds in the use of robotic loaders as the substrates are positioned more precise and uniform. Finally, the use of a design which has one side that does not have an upper rail allows for greater access of robotic forks because the margin of distance before collision between the rails and the robotic forks occurs is greatly improved Thus, in one embodiment, a horizontal substrate carrier design is provided in which three rails are utilized, only one being an upper rail. The upper rail is placed at a relatively high angular location, 60° or greater. One side of the horizontal substrate carrier has no upper rail, allowing easy robotic access. The design reduces the amount of substrate tilting which has direct effects on (1) reducing substrate rattling/moving which reduces particle generation and (2) improving substrate loading and unloading which also reduces particle generation. The substrates may be held vertically by the walls of the slots 505 on the upper rail 310. The substrates randomly rest on one wall or the other of a corresponding slot 505. The use of only three rails provides further advantages because much of the particles generated during the use of horizontal substrate carriers comes from the interaction between the substrate and the rail slots during loading/unloading and carrier movement. Limiting the contact points decreases these particles.

Though not the most preferred embodiment, the techniques described herein may also be utilized with horizontal substrate carrier designs which use 4 (or even more) rails. For example, at least some the benefits may be achieved by provide three lower rails. In one case, a center rail may be placed between the two lower rails 315 of the design of FIG. 3. Though an additional fourth rail would potentially generate particles, such design would still advantageously utilize a carrier design that has one high angle upper rail on one side of the carrier and no upper rail on the other side, thus allowing robotic access to the horizontal substrate carrier while still having at least one upper rail placed high up the carrier. It will be recognized that other embodiments may similarly be used will still gaining at least some of the benefits of the techniques described herein.

Those skilled in the art will recognize that a variety of materials may be utilized for the materials of the horizontal substrate carrier, and that the particular material chosen may depend upon the process application of the carrier. For example, for a furnace anneal process used for to process a semiconductor substrate, the carrier may be formed of quartz. Other carrier materials may include, but are not limited to, silicon, silicon carbide, silicon nitride, and other ceramics.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A horizontal substrate carrier, comprising:
   a plurality of horizontal rails, the horizontal rails extending along the horizontal substrate carrier horizontally;
   a plurality of slots for holding a substrate, the slots located in the plurality of horizontal rails, the plurality of horizontal rails arranged so that only slots of three horizontal rails will engage a substrate carried in the horizontal substrate carrier, wherein the plurality of horizontal rails are asymmetrical such that a first side of the horizontal substrate carrier has a first rail at a first angular position of 60 degrees or more, and a second side of the horizontal substrate carrier has a second rail at a second angular position of less than 60 degrees, the first and second angular positions being relative to a vertical line extending from a central horizontal axis of the horizontal substrate carrier to a bottom of the horizontal substrate carrier, the central horizontal axis of the horizontal substrate carrier being a reference axis of rotation for the first and second angular positions; and
   a counterbalance located on the second side of the horizontal substrate carrier.

2. The horizontal substrate carrier of claim 1, wherein the plurality of horizontal rails further comprise a third rail on the first side of the horizontal substrate carrier at a third angular position of less than 60 degrees.

3. The horizontal substrate carrier of claim 1, wherein the counterbalance is connected to the second rail.

4. The horizontal substrate carrier of claim 1, wherein the first rail is at an angular position of 70 to 90 degrees around the reference axis and relative to the vertical line.

5. The horizontal substrate carrier of claim 4, further comprising a third rail on the first side of the horizontal substrate carrier, wherein the second and third rails are at angular positions of 45 degrees or less around the reference axis and relative to the vertical line.

6. The horizontal substrate carrier of claim 1, wherein the configuration of the plurality of slots and the plurality of horizontal rails provides for holding the substrate with a vertical deviation of less than +/−0.1 degrees.

7. A horizontal substrate carrier, comprising:
a plurality of horizontal rails, the plurality of horizontal rails extending along the horizontal substrate carrier horizontally between a first end support structure at a first end of the horizontal substrate carrier and a second end support structure at a second end of the horizontal substrate carrier, first ends of the plurality of horizontal rails connected to the first end support structure and second ends of the plurality of horizontal rails connected to the second end support structure, the plurality of horizontal rails comprising,
a first lower rail on a first side of the horizontal substrate carrier,
a second lower rail on a second side of the horizontal substrate carrier, and
a first upper rail on a first side of the horizontal substrate carrier,
wherein the plurality of horizontal rails are configured so that only three horizontal rails engage a substrate when the substrate is carried in the horizontal substrate carrier,
wherein the first upper rail being at an angular position of 60 degrees or more relative to a vertical line extending from a central horizontal axis of the horizontal substrate carrier to a bottom of the horizontal substrate carrier, the central horizontal axis of the horizontal substrate carrier being a reference axis of rotation for the angular position, and wherein the first lower rail and the second lower rail both being at angular positions of 45 degrees or less around the reference axis relative to the vertical line, and
wherein none of the plurality of horizontal rails is located on the second side of the horizontal substrate carrier at angular positions of 45 degrees or more around the reference axis; and
a counterbalance located on the second side of the horizontal substrate carrier.

8. The horizontal substrate carrier of claim 7, the first upper rail being at an angular position of 70 to 90 degrees around the reference axis relative to the vertical line.

9. The horizontal substrate carrier of claim 8, the first lower rail and the second lower rail both being at angular positions between 25 to 30 degrees around the reference axis relative to the vertical line.

10. The horizontal substrate carrier of claim 9, the first upper rail being at an angular position of 90 degrees around the reference axis relative to the vertical line.

11. The horizontal substrate carrier of claim 7, wherein the counterbalance is connected to the second lower rail.

12. The horizontal substrate carrier of claim 7, wherein the counterbalance is connected to the first end support structure and the second end support structure.

13. A horizontal substrate carrier, comprising:
a plurality of horizontal rails, the plurality of horizontal rails extending along the horizontal substrate carrier horizontally between a first end support structure at a first end of the horizontal substrate carrier and a second end support structure at a second end of the horizontal substrate carrier, first ends of the plurality of horizontal rails connected to the first end support structure and second ends of the plurality of horizontal rails connected to the second end support structure, the plurality of horizontal rails comprising,
a first lower rail on a first side of the horizontal substrate carrier,
a second lower rail on a second side of the horizontal substrate carrier, and
a first upper rail on a first side of the horizontal substrate carrier;
wherein the second lower rail is heavier than the first lower rail to offset a combined weight of the first lower rail and the first upper rail,
wherein none of the plurality of horizontal rails is located on the second side of the horizontal substrate carrier at angular positions of 45 degrees or more relative to a vertical line extending from a central horizontal axis of the horizontal substrate carrier to a bottom of the horizontal substrate carrier, the central horizontal axis of the horizontal substrate carrier being a reference axis of rotation for the angular position.

14. The horizontal substrate carrier of claim 13, wherein the first upper rail is at an angular position of 70 to 90 degrees relative to the vertical line.

15. The horizontal substrate carrier of claim 14, wherein the first lower rail and the second lower rail both are at angular positions of 25 to 30 degrees relative to the vertical line.

16. A substrate processing system, comprising:
a furnace having a horizontal heating chamber; and
a horizontal substrate carrier within the horizontal heating chamber, the horizontal substrate carrier, comprising:
a plurality of horizontal rails, the horizontal rails extending along the horizontal substrate carrier horizontally;
a plurality of slots for holding a substrate, the slots located in the plurality of horizontal rails, the plurality of horizontal rails arranged so that only slots of three horizontal rails will engage a substrate carried in the horizontal substrate carrier;
wherein the plurality of horizontal rails are asymmetrical such that a first side of the horizontal substrate carrier has a first rail at a first angular position of 60 degrees or more, and a second side of the horizontal substrate carrier does not have a corresponding second rail at a second angular position on the second side of the horizontal substrate carrier corresponding to the first angular position, the first and second angular positions being relative to a vertical line from a central horizontal axis of the horizontal substrate carrier to a bottom of the horizontal substrate carrier, the central horizontal axis of the horizontal substrate carrier being a reference axis of rotation for the first and second angular positions; and
a counterbalance located on the second side of the horizontal substrate carrier.

17. The substrate processing system of claim 16, wherein the counterbalance is connected to the second lower rail.

18. The substrate processing system of claim 16, wherein the plurality of horizontal rails further comprise a second rail on the second side of the horizontal substrate carrier at another angular position of less than 60 degree around the reference axis and relative to the vertical line.

19. The substrate processing system of claim 16, wherein the plurality of horizontal rails further comprise a third rail on the first side of the horizontal substrate carrier at a third angular position of less than 60 degrees around the reference axis and relative to the vertical line.

20. The substrate processing system of claim 16, wherein the first angular position is 70 to 90 degrees around the reference axis and relative to the vertical line.

21. The substrate processing system of claim 16, wherein the plurality of horizontal rails further comprise a second rail and a third rail, the second rail being on the second side of the horizontal substrate carrier and the third rail being on the first side of the horizontal substrate carrier, wherein the second and third rails are at angular positions of 45 degrees or less around the reference axis and relative to the vertical line.

* * * * *